United States Patent
Nakata et al.

(10) Patent No.: US 6,781,400 B2
(45) Date of Patent: *Aug. 24, 2004

(54) METHOD OF TESTING SEMICONDUCTOR INTEGRATED CIRCUITS AND TESTING BOARD FOR USE THEREIN

(75) Inventors: Yoshiro Nakata, Kyoto (JP); Shinichi Oki, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/322,571

(22) Filed: Dec. 19, 2002

(65) Prior Publication Data

US 2003/0090288 A1 May 15, 2003

Related U.S. Application Data

(62) Division of application No. 10/127,580, filed on Apr. 23, 2002, now abandoned, which is a division of application No. 09/811,422, filed on Mar. 20, 2001, now Pat. No. 6,400,175, which is a division of application No. 09/140,323, filed on Aug. 26, 1998, now Pat. No. 6,229,329.

(30) Foreign Application Priority Data

Sep. 4, 1997 (JP) .............................................. 9-239281

(51) Int. Cl.⁷ .............................................. G01R 31/02
(52) U.S. Cl. .................................... 324/765; 324/158.1
(58) Field of Search ................................ 324/760, 765, 324/755, 719; 257/40, 48; 438/14, 17, 18

(56) References Cited

U.S. PATENT DOCUMENTS

| | | | |
|---|---|---|---|
| 4,288,911 A | 9/1981 | Ports | |
| 5,053,700 A | 10/1991 | Parrish | |
| 5,124,639 A | 6/1992 | Carlin et al. | |
| 5,559,446 A | 9/1996 | Sano | |
| 5,623,214 A | 4/1997 | Pasiecznik, Jr. | |
| 5,670,889 A | 9/1997 | Okubo et al. | |
| 5,901,114 A | 5/1999 | Baravian | |
| 6,229,329 B1 * | 5/2001 | Nakata et al. | 324/765 |
| 6,400,175 B2 | 6/2002 | Nakata et al. | |

FOREIGN PATENT DOCUMENTS

| | | |
|---|---|---|
| JP | 63-031130 | 2/1988 |
| JP | 06-097241 | 4/1994 |
| JP | 06-335159 | 12/1994 |
| JP | 07-169806 | 7/1995 |
| JP | 09-139195 | 5/1997 |

* cited by examiner

Primary Examiner—Vinh P. Nguyen
(74) Attorney, Agent, or Firm—Nixon Peabody LLP; Donald R. Studebaker (57) ABSTRACT

A method of testing semiconductor integrated circuits comprises the step of simultaneously testing a plurality of semiconductor integrated circuit elements for electric characteristics by applying a voltage to the respective testing electrodes of the semiconductor integrated circuit elements. The simultaneous testing step includes the step of applying the voltage to the respective testing electrodes of the semiconductor integrated circuit elements via PTC elements provided for the semiconductor integrated circuit elements in a one-to-one relationship.

1 Claim, 5 Drawing Sheets

METHOD OF TESTING SEMICONDUCTOR INTEGRATED CIRCUITS AND TESTING BOARD FOR USE THEREIN

This application is a division of Ser. No. 10/127,580 A1 Apr. 23, 2002, now abandoned which is a division of Ser. No. 09/811,422 A1 Mar. 20, 2001 U.S. Pat. No. 6,400,175 Jun. 4, 2002 A1 U.S. which is a division of Ser. No. 09/140,323 A1 Aug. 26, 1998 U.S. Pat. No. 6,229,329 May 8, 2001 A1 U.S.

BACKGROUND OF THE INVENTION

The present invention relates to a method of testing semiconductor integrated circuits whereby a plurality of semiconductor integrated circuit elements (semiconductor chips) are tested simultaneously for electric characteristics and to a testing board for use in the testing method.

In the process of fabricating a conventional semiconductor integrated circuit device, an electrical connection is provided between a semiconductor chip and a leadframe by a bonding wire and then the semiconductor chip and the leads of the leadframe are sealed with a resin or ceramic to be mounted on a printed circuit board.

To meet the demand for an electronic device reduced in both size and price, there has been developed a method of mounting, on a circuit board, a semiconductor integrated circuit device as a bare chip cut out of a semiconductor wafer. The bare chip used in the method is preferably a quality-assured bare chip supplied at lower price. For the quality assurance of a bare chip, it is preferable, in terms of cost reduction, to perform a simultaneous burn-in process with respect to a plurality of semiconductor chips formed in a single semiconductor wafer.

In accordance with a known testing method, a simultaneous burn-in process is performed with respect to a plurality of semiconductor chips formed in a semiconductor wafer by using a contactor having probe terminals to be connected to the respective testing electrodes of the semiconductor chips. In this case, it is required to apply power-source voltage or ground voltage to the testing electrode of each of the semiconductor chips. For individual application of the power-source voltage or ground voltage to the testing electrodes of the semiconductor chips, however, a large number of wires should be routed over the contactor or semiconductor wafer, which is not realistic.

To overcome the drawback of the method, there has been proposed another method wherein a common power-source-voltage supply line or ground-voltage supply line (hereinafter generally referred to as common voltage supply lines) is provided such that power-source voltage or ground voltage is applied to each of the testing electrodes therethrough, thus avoiding the necessity for routing a large number of wires.

However, the provision of such common voltage supply lines on the contactor or semiconductor wafer is disadvantageous in that, if a defective semiconductor chip electrically short-circuited exists in the semiconductor wafer, the common power-source-voltage supply line and the common ground-voltage supply line are short-circuited via the defective semiconductor chip.

To eliminate the disadvantage, U.S. patent application Ser. No. 08/358,609 (Japanese Unexamined Patent Publication No. 7-169806) has proposed a method of testing semiconductor integrated circuits wherein the individual semiconductor chips are preliminarily tested for electric characteristics before a burn-in process is performed thereto and the semiconductor chip judged to be defective in the preliminary test is coated with a liquid insulating agent. The liquid insulating agent is then cured to form a non-conductive layer over the testing electrode of the defective semiconductor chip, thereby preventing a current flow through the defective semiconductor chip. After that, a simultaneous burn-in process is performed with respect to the other conforming semiconductor chips.

Although the conventional method of testing semiconductor integrated circuits can screen out the semiconductor chip judged to be defective in the preliminary electric characteristic test before the burn-in process, it is still disadvantageous in that, if a defective semiconductor chip is produced for some reason during the burn-in process, the burn-in process cannot be performed with respect to the other conforming semiconductor chips.

For example, there are cases where some disturbance causes a latch-up phenomenon in a CMOS integrated circuit during the burn-in process so that an abnormal current flows through the CMOS integrated circuit having undergone the latch-up phenomenon. Since a large current flows between the common power-source voltage line and the common ground voltage line via the semiconductor chip having undergone the latch-up phenomenon, the burn-in process cannot be performed with respect to the other semiconductor chips.

Moreover, since wiring is more complicated and the density of a current flowing through the wiring is higher in a semiconductor integrated circuit becoming denser and increasingly miniaturized, the current density excessively increased by some disturbance in the burn-in process may cause an electromigration, which leads to a short circuit in the wiring. In this case also, a large current flows between the common power-source voltage line and the common ground voltage line via the semiconductor chip having undergone the electromigration and the burn-in process cannot also be performed with respect to the other semiconductor chips.

If a defective semiconductor chip is produced during the burn-in process for some reason and an extraordinarily large quantity of current flows through the defective semiconductor chip, the temperature of the defective semiconductor chip is increased to a high degree so that another conforming semiconductor chip adjacent to the defective semiconductor chip is also heated to a high temperature, resulting in abnormal operation. Thus, even when the defective semiconductor chip and the conforming semiconductor chip are not connected to the common voltage supply line, the burn-in process cannot be performed with respect to the conforming semiconductor chip as long as they are formed in a single wafer.

To circumvent the occurrence of a reversible short circuit such as the latch-up phenomenon and an irreversible short circuit in one semiconductor chip, which prevents the application of a voltage from the common voltage supply line to another semiconductor chip or the testing of the electric characteristics of a conforming semiconductor chip formed adjacent to a defective semiconductor chip abnormally heated on a single semiconductor wafer, a fuse may be interposed between the voltage supply line and the testing electrode of the semiconductor chip, thereby electrically disconnecting the defective semiconductor chip from the voltage supply line.

However, the fuse interposed between the voltage supply line and the testing electrode presents the problems that, once a defective semiconductor chip is produced, the fuse melts and needs replacing and that, once an irreversible short circuit such as the latch-up phenomenon occurs, the electric characteristics cannot be tested even when the irreversible short circuit is eliminated.

SUMMARY OF THE INVENTION

In view of the foregoing, it is therefore a first object of the present invention to ensure the testing of the electric characteristics of a plurality of semiconductor chips with the application of a voltage to the respective testing electrodes of the semiconductor chips without using a fuse. A second object of the present invention is to ensure the testing of the electric characteristics of a plurality of a semiconductor chips with the application of a voltage supplied from a common voltage supply line to the respective testing electrodes of the semiconductor chips without using a fuse.

A method of testing semiconductor integrated circuits according to the present invention comprises the step of simultaneously testing a plurality of semiconductor integrated circuit elements for electric characteristics by applying a voltage to respective testing electrodes of the semiconductor integrated circuit elements, the step including the step of applying the voltage to the respective testing electrodes of the semiconductor integrated circuit elements via at least one PTC (Positive Temperature Coefficient) element.

In the method of testing semiconductor integrated circuits according to the present invention, the voltage is applied to each of the testing electrodes of the semiconductor integrated circuit elements via the corresponding PTC element. Therefore, if one of the semiconductor chips is defective in the first place or a defective semiconductor chip is produced in the step and a large quantity of current flows through the defective semiconductor chip, the large quantity of current also flows through the PTC element connected to the defective semiconductor chip so that the temperature of the PTC element is increased to a high degree, which remarkably increases the resistance thereof. As a result, the voltage is no more applied to the defective semiconductor chip and the semiconductor chips other than the defective one are no more heated to a high temperature, which allows excellent testing of the other semiconductor chips.

Once the cause of the defective semiconductor chip through which the large quantity of current has flown is eliminated, the semiconductor chip returns to a normal temperature so that the temperature of the PTC element connected to the semiconductor chip is also lowered and the voltage is applied again to the semiconductor chips.

In the method of testing semiconductor integrated circuits according to the present invention, the step preferably includes the step of applying the voltage to the respective testing electrodes of the semiconductor integrated circuit elements via the plurality of PTC elements provided in a one-to-one relationship for the semiconductor integrated circuit elements.

In the arrangement, even when an extraordinarily large quantity of current flows through the defective semiconductor chip, the semiconductor chip adjacent to the defective one is not heated to a high temperature, which allows excellent testing of the semiconductor chips other than the defective one.

In the method of testing semiconductor integrated circuits according to the present invention, the step preferably includes the step of applying the voltage to the respective testing electrodes of the semiconductor integrated circuit elements via the plurality of PTC elements provided in a one-to-one relationship for individual blocks formed by dividing the semiconductor integrated circuit elements into groups.

In the arrangement, even when an extraordinarily large quantity of current flows through the defective semiconductor chip, the semiconductor chips contained in the blocks other than the block containing the defective semiconductor chip are not heated to a high temperature, which allows excellent testing of the semiconductor chips contained in the other blocks.

In the method of testing the semiconductor integrated circuits, the step preferably includes the step of applying the voltage from a common voltage supply line to the respective testing electrodes of the semiconductor integrated circuit elements.

This prevents the application of the voltage to the defective semiconductor integrated circuit element and the occurrence of a short circuit in the power-source voltage line and ground line via the defective semiconductor chip, resulting in normal application of the voltage to the other semiconductor chips. Consequently, the other semiconductor chips can excellently be tested irrespective of the application of the voltage from the common voltage supply line to the respective testing electrodes of the semiconductor integrated circuit elements.

In the method of testing semiconductor integrated circuits according to the present invention, the step preferably includes a burn-in process.

Even when an extraordinarily large quantity of current flows through the defective semiconductor chip in the burn-in process, the arrangement allows a burn-in process to be excellently performed with respect to the other semiconductor chips.

In the method of testing semiconductor integrated circuits according to the present invention, the plurality of semiconductor integrated circuit elements are preferably formed in a semiconductor wafer and the step preferably includes the step of performing a wafer-level burn-in process with respect to the semiconductor integrated circuit elements formed in the wafer.

Even when an extraordinarily large quantity of current flows through the defective semiconductor chip formed in the semiconductor wafer during the burn-in process, the arrangement allows a burn-in process to be performed excellently with respect to the other semiconductor chips formed in the same semiconductor wafer.

In the method of testing semiconductor integrated circuits according to the present invention, the plurality of semiconductor integrated circuit elements are preferably mounted on a burn-in board and the step preferably includes the step of performing a simultaneous burn-in process with respect to the semiconductor integrated circuit elements.

Even when an extraordinarily large quantity of current flows through the defective semiconductor chip mounted on the burn-in board during the burn-in process, the arrangement allows a burn-in process to be performed excellently with respect to the other semiconductor chips mounted on the same semiconductor wafer.

In the method of testing semiconductor integrated circuits according to the present invention, the PTC element is preferably a polymer PTC element.

Since the polymer PTC element has low resistance in the steady state, it is less likely to exert adverse effects on the testing of the electric characteristics. On the other hand, the polymer PTC element has extremely high resistance in a high-temperature state so that the application of the voltage to the defective semiconductor chip is surely prevented.

A testing board according to the present invention is for simultaneously testing a plurality of semiconductor integrated circuit elements for electric characteristics by applying a voltage to respective testing electrodes of the semiconductor integrated circuit elements and comprises: a plurality of connection terminals provided on a substrate to be connected to the respective testing electrodes of the semiconductor integrated circuit elements; a voltage supply line provided in the substrate to supply the voltage to the connection terminals; and at least one PTC element provided on the substrate to be interposed between the voltage supply line and at least one of the connection terminals.

Since the PTC element is connected between the voltage supply line and at least one of the connection terminals in the testing board according to the present invention, the voltage is supplied to each of the testing electrodes of the semiconductor integrated circuit elements via the corresponding PTC element. Consequently, if one of the semiconductor chips is defective in the first place or a defective semiconductor chip is produced in the step and an extraordinarily large quantity of current flows through the defective semiconductor chip, the large quantity of current also flows through the PTC element connected to the defective semiconductor chip so that the temperature of the PTC element is increased to a high degree, which remarkably increases the resistance thereof. As a result, the voltage is no more applied to the defective semiconductor chip and the semiconductor chips other than the defective one are no more heated to a high temperature, which allows excellent testing of the other semiconductor chips.

Once the cause of the defective semiconductor chip through which the large quantity of current has flown is eliminated, the semiconductor chip returns to a normal temperature so that the temperature of the PTC element connected to the semiconductor chip is also lowered and the voltage is applied again to the semiconductor chip.

In the testing board according to the present invention, the testing board is preferably a probe card for simultaneously testing the electric characteristics of the semiconductor integrated circuit elements formed in a semiconductor wafer and the connection terminals are preferably probe terminals positioned on the substrate to correspond to the respective testing electrodes of the semiconductor integrated circuit elements.

Even when an extraordinarily large quantity of current flows through the defective semiconductor chip formed in the semiconductor wafer, the arrangement allows an excellent burn-in process to be performed with respect to the other semiconductor chips formed in the same semiconductor wafer.

In the case where the testing board according to the present invention is a probe card, the probe terminals are preferably provided on one side of the substrate, the voltage supply line is preferably provided on the other side of the substrate, and the plurality of PTC elements are preferably provided on the other side of the substrate to correspond to the probe terminals in a one-to-one relationship.

By thus providing the probe terminals on one side of the substrate and the voltage supply line as well as the PTC elements on the other side of the substrate, a sufficiently large region is allowed for the PTC elements so that the PTC elements are easily provided for the probe terminals in a one-to-one relationship.

In the case where the testing board according to the present invention is a probe card, the voltage supply line is preferably a common voltage supply line connected in common to the plurality of probe terminals.

The arrangement reduces the number of voltage supply lines and facilitates the placement of the voltage supply lines.

In the case where the testing board according to the present invention is a probe card and the voltage supply line is a common voltage supply line, the probe terminals and the voltage supply line are preferably provided on one side of the substrate and the plurality of PTC elements are preferably provided on peripheral portions of one side of the substrate to correspond to individual blocks formed by dividing the probe terminals into groups in a one-to-one relationship.

This eliminates the necessity to provide contacts for connecting the plurality of probe terminals to the common voltage supply line through the card body, so that the manufacturing of the probe card is facilitated.

In the testing board according to the present invention, the PTC element is preferably characterized in that the resistance thereof is increased significantly from a value in a steady state when the temperature of the PTC element substantially exceeds 100° C.

The arrangement allows the testing board to be used in a burn-in process performed at a temperature lower than 100° C., e.g., on the order of 80° C.

In the testing board according to the present invention, the PTC element is preferably a polymer PTC element.

Since the polymer PTC element has low resistance in the steady state, it is less likely to exert adverse effects on the testing of the electric characteristics. On the other hand, the polymer PTC element has extremely high resistance in a high-temperature state so that the application of the voltage to the defective semiconductor chip is surely prevented.

BRIEF DESCRIPTION OF THE DRAWINGS

FIG. 1 show a probe card according to a first embodiment of the present invention, of which

FIG. 2 show a probe card according to a second embodiment of the present invention, of which

FIG. 3 show a probe card according to a third embodiment of the present invention, of which

DETAILED DESCRIPTION OF THE INVENTION

Embodiment 1

A probe card according to a first embodiment of the present invention and a method of testing semiconductor integrated circuits by using the probe card will be described with reference to FIGS. 1(a) and 1(b)

Figure 1A:
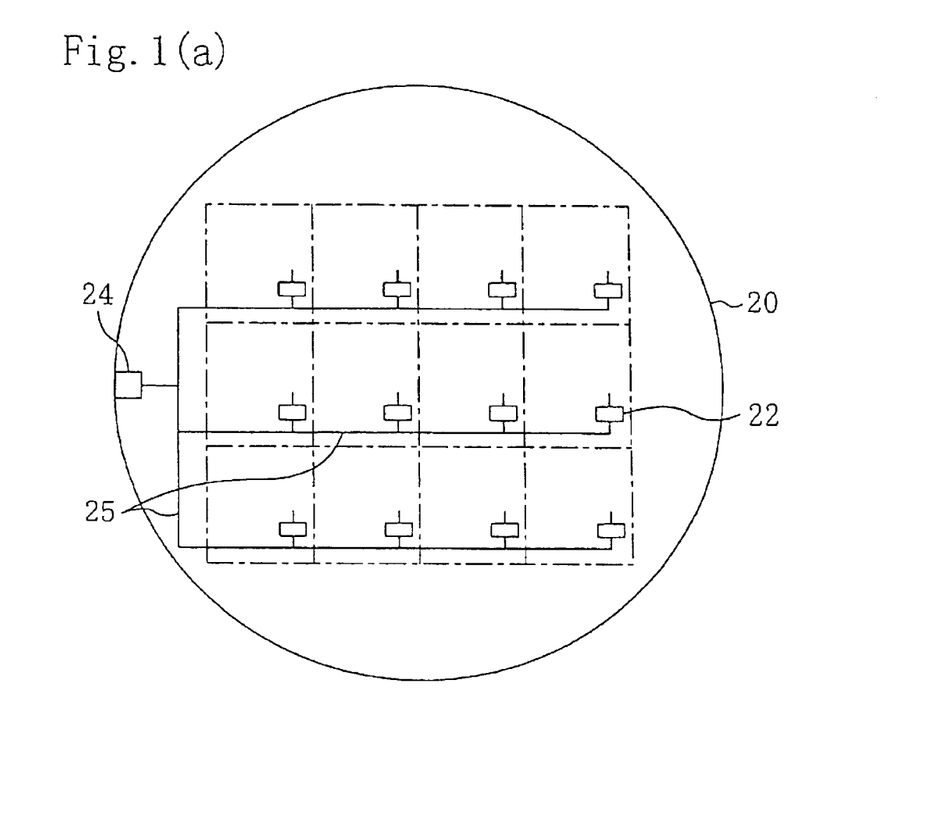
FIG. 1(a) is a plan view thereof and FIG. 1(b) is a cross-sectional view thereof.
Figure 1B:
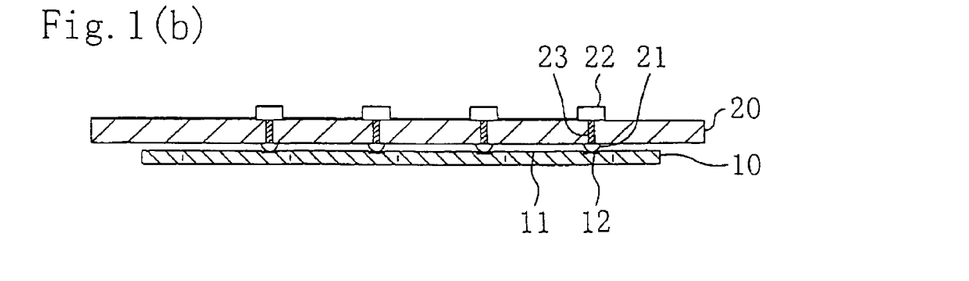

FIG. 1(a) shows the plan structure of the undersurface of the probe card and FIG. 1(b) shows the cross-sectional structure of the probe card.

As shown in FIG. 1(b), a plurality of semiconductor chips 11 are formed in a semiconductor wafer 10. Each of the semiconductor chips 11 is formed with a testing electrode 12. Although a plurality of testing electrodes 12 are normally formed in each of the semiconductor chips 11, FIG. 1(b) shows the case where only one testing electrode 12 is formed in each of the semiconductor chips 11 for the sake of convenience. The array of rectangles defined by the dash-dot lines in FIG. 1(a) indicate respective regions in which the semiconductor chips 11 are formed.

As shown in FIGS. 1(a) and 1(b), probe terminals 21 are formed on the surface of a card body 20 constituting the probe card to correspond to the respective testing electrodes 12 of the semiconductor chips 11. The portions of the undersurface of the card body 20 corresponding to the probe terminals 21 are formed with respective PTC elements 22. In the portions of the card body 20 formed with the probe terminals 21, there are formed contacts 23 extending perpendicularly through the card body 20. The contacts 23 have surfaces connected to the corresponding probe terminals 21 and undersurfaces connected to the corresponding PTC elements 22.

An external electrode 24 to which a voltage is applied from an external device is formed on the peripheral portion of the undersurface of the card body 20, while a common voltage supply line 25 for connecting the external electrode 24 to each of the PTC elements 22 extends divergently over the undersurface of the card body 20. With the arrangement, the voltage applied to the external electrode 24 is applied to each of the probe terminals 21 via the common voltage supply line 25 and the contacts 23. The common voltage supply line 25 may be a power-source-voltage supply line for applying power-source voltage or a ground-voltage supply line for applying ground voltage.

As the PTC element 22, a polymer PTC element or a ceramic PTC element composed of barium titanate ($BaTiO_3$) or the like may be used.

The polymer PTC element is a resistor element composed of electrically conductive carbon mixed with an insulating polymer such as polyolefin or fluororesin. Since carbon dispersed in the polymer forms a large number of conductive paths in the steady state, the polymer PTC element has a low resistivity. If the temperature of the polymer PTC element in the steady state is gradually increased, the carbon conductive paths are gradually disconnected since the thermal expansion coefficient of the polymer is higher than that of carbon, so that a moderate PTC characteristic is observed. After a specified temperature (which can be set as desired by adjusting the mixture ratio of conductive carbon to the insulating polymer or selecting the type of the insulating polymer) is reached, the PTC effect abruptly becomes noticeable. Since a volume variation corresponding to several tens of percentage is caused by the melted polymer and disconnects the carbon conductive paths one after another, the resistance value is increased by several, e.g., five orders of magnitude.

For the ceramic PTC element, the specified temperature at which the PTC effect becomes noticeable can be set by adjusting the amount of an impurity to be added. In a ceramic PTC element composed of barium titanate, e.g., the specified temperature at which the PTC effect becomes noticeable can be shifted to higher degrees with the addition of Pb as the impurity. The specified temperature can be shifted to much higher degrees with an increase in the amount of Pb to be added.

A phenomenon in which the resistance of the PTC element is increased significantly from the value in the steady state due to a large quantity of current flowing through the PTC element or an increase in the temperature of the PTC element is termed a "trip." In the steady state, the resistance of the PTC element is stable at an extremely low value compared with load. However, if the quantity of the current flowing through the PTC element exceeds a standard value (trip current) determined by the characteristics of the PTC element, the resistance of the PTC element is increased by self-heating so that the current flowing through the PTC element is limited to an extremely small quantity. Once the PTC element is in the trip state, the PTC element is stabilized with high resistance so that the PTC element sustains the trip state. When the PTC element returns to the original temperature upon disconnection from the power source or the voltage in the circuit is reduced to a sufficiently low value (the amount of heat generated by the PTC element becomes smaller than the amount of heat released therefrom), the PTC element automatically shifts to the steady state.

A description will be given to the method of testing semiconductor devices by using the probe card according to the first-embodiment.

First, power-source voltage or ground voltage is applied to the external voltage 24 of the probe card with the respective testing electrodes 12 of the semiconductor chips 11 formed in the semiconductor wafer 10 being connected to the corresponding probe terminals 21 of the probe card. In this case, the power-source voltage is applied to the external electrode 24 when the substrate of the semiconductor chips 11 is connected to the ground voltage. On the other hand, the ground voltage is applied to the external electrode 24 when the substrate of the semiconductor chips 11 is connected to the power-source voltage. The voltage applied to the external electrode 24 is applied to each of the testing electrodes 12 via the common voltage supply line 25, the PTC elements 22, the contacts 23, and the probe terminals 21.

Next, the semiconductor wafer 10 and the probe card are held at a specified temperature for a burn-in process with the voltage being applied to each of the testing electrodes 12. If any of the semiconductor chips 11 is defective in the first place or a defective semiconductor chip is produced during the burn-in process and an extraordinarily large quantity of current is allowed to flow through the defective semiconductor chip 11, the large quantity of current also flows through the PTC element 22 connected to the defective semiconductor chip 11. Accordingly, the temperature of the PTC element 22 through which the large quantity of current has flown is increased to a high degree, which remarkably increases the resistance thereof and prevents the voltage from being applied to the defective semiconductor chip 11.

This suppresses the temperature increase in the defective semiconductor chip 11, so that the semiconductor chip 11 adjacent to the defective one is prevented from being heated to an extraordinarily high temperature and inhibiting the normal burn-in process. This also suppresses the occurrence of a short circuit in the power-source voltage line and ground voltage line via the defective semiconductor chip 11, so that there is no such case where a voltage is prevented from being applied to the conforming semiconductor chips 11.

According to the first embodiment, since the plurality of probe terminals 21 are provided on the surface of the card body 20, while the common power supply line 25 is provided on the undersurface thereof, sufficient space is left to the undersurface of the card body 20 and allows the PTC element 22 to be provided on the undersurface of the card body 20 for each of the semiconductor chips 11.

It is to be noted that the method of testing semiconductor devices by using the probe card according to the first embodiment is not limited to a burn-in process performed with respect to the semiconductor chips formed in a wafer, but may be applied to the testing of normal electric characteristics.

Figure 5:
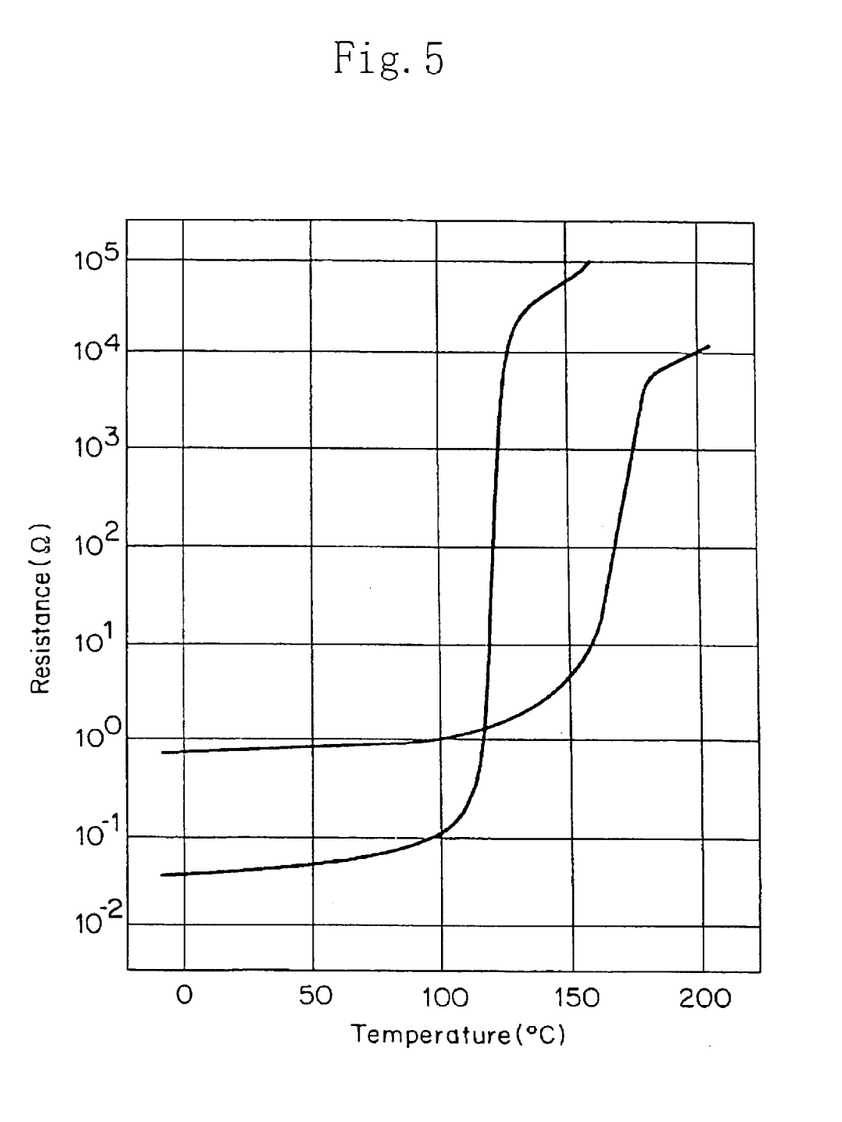
FIG. 5 is a graph showing the relationship between the temperature and resistance of a polymer PTC element.

FIG. 5 shows the relationships between the temperatures and resistances of polymer PTC elements. In the polymer PTC element A, the PTC effect abruptly becomes noticeable when the temperature exceeds 125° C. In the polymer PTC element B, the PTC effect abruptly becomes noticeable when the temperature exceeds 160° C. Hence, the polymer PTC element A is suitable for a burn-in process performed at a temperature on the order of 100° C., while the polymer PTC element B is suitable for a burn-in process performed at a temperature on the order of 150° C.

TABLE 1

| ITEM | POLYMER PTC ELEMENT | CERAMIC PTC ELEMENT | FUSE |
|---|---|---|---|
| RESISTANCE IN STEADY STATE | SEVERAL MILLIMETERS OF OHMS TO SEVERAL TENS OF OHMS | SEVERAL OHMS TO SEVERAL TENS OF OHMS | LOW |
| BROKEN STATE | INCREASE IN RESISTANCE | INCREASE IN RESISTANCE | BROKEN BY MELTING |
| RESISTANCE IN BROKEN STATE | MEDIUM | LOW | BROKEN |
| HEATING VALUE OF ELEMENT | LOW | HIGH | LOW |
| ELEMENT SIZE | SMALL | MEDIUM | LARGE |
| SHOCK RESISTANCE | HIGH | VERY LOW | LOW |

Table 1 shows for comparison the respective characteristics of a polymer PTC element (Polyswitch commercially available from Raychem Corp.), a ceramic PTC element, and a fuse. As is obvious from Table 1, the polymer PTC element and the ceramic PTC element uses a system in which increased resistance brakes a circuit, not a system in which melting brakes a circuit, which is used by the fuse, so that there is no need for replacement after the circuit is broken. The polymer PTC element is preferred to the ceramic PTC element because of its lower resistance in the steady state and smaller element size.

Embodiment 2

A probe card according to a second embodiment of the present invention and a method of testing semiconductor integrated circuits by using the probe card will be described with reference to FIGS. 2(a) and 2(b)

Figures 2A, 2B:
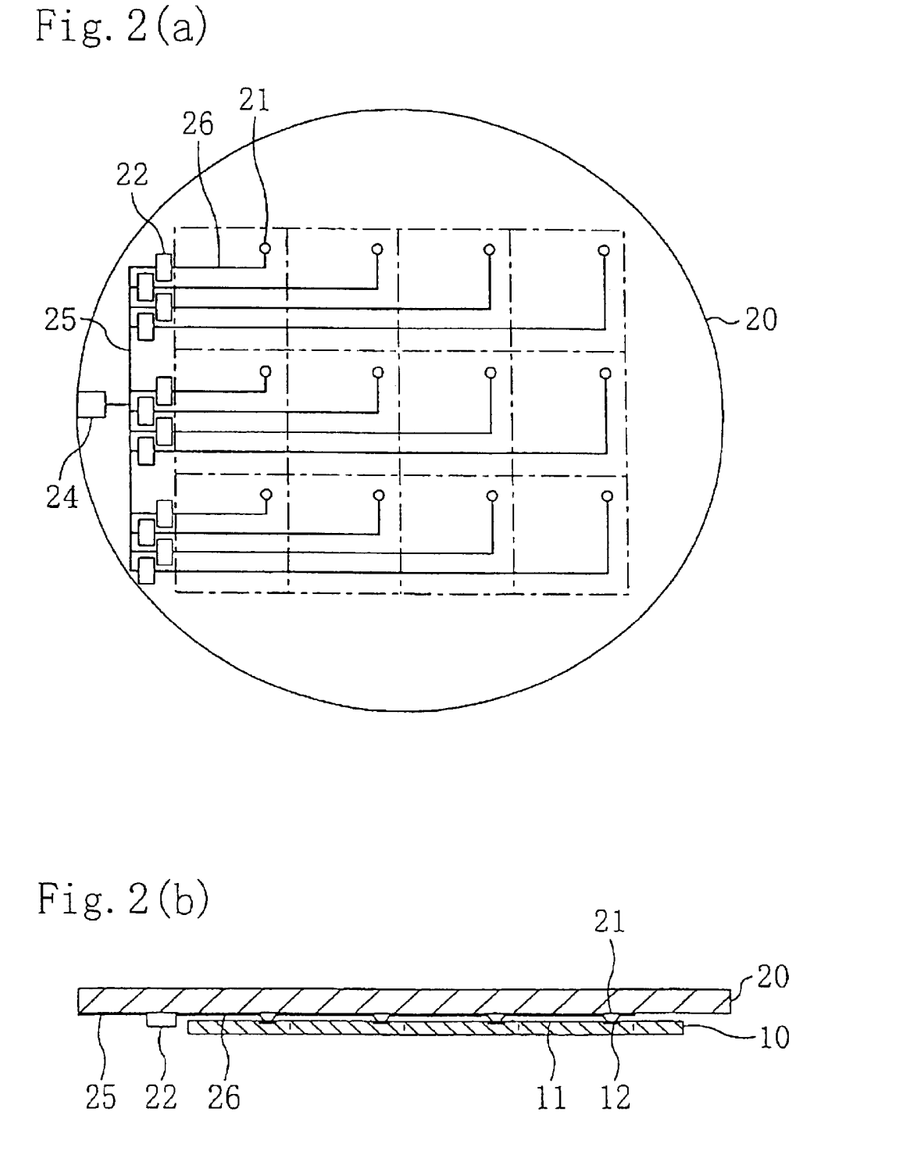
FIG. 2(a) is a plan view thereof and FIG. 2(b) is a cross-sectional view thereof.

FIG. 2(a) shows the plan structure of the surface of the probe card and FIG. 2(b) shows the cross-sectional structure of the probe card.

As shown in FIGS. 2(a) and 2(b), probe terminals 21 are formed on the surface of a card body 20 constituting the probe card to correspond to the respective testing electrodes of the semiconductor chip 11. PTC elements 22 are formed on the peripheral portions of the surface of the card body 20 to correspond to the probe terminals 21 in a one-to-one relationship. An external electrode 24 to which a voltage is applied from an external device is also formed on the peripheral portion of the surface of the card body 20. A common voltage supply line 25 for connecting the external electrode 24 to each of the PTC elements 22 extends divergently over the surface of the card body 20, while the PTC elements 22 are connected to the individual probe terminals 21 via separate voltage supply lines 26. When a voltage is applied to the external electrode 24, the applied voltage is applied to each of the probe terminals 21 via the common voltage supply line 25, the PTC elements 22, and the separate voltage supply lines 26. It is to be noted that each of the common voltage supply line 25 and the separate voltage supply lines 26 may be a power-source-voltage supply line for applying power-source voltage or a ground-voltage supply line for applying ground voltage.

As the PTC element 22, a polymer PTC element or a ceramic PTC element composed of barium titanate or the like may be used, similarly to the first embodiment.

A description will be given to the method of testing semiconductor devices by using the probe card according to the second embodiment.

Similarly to the first embodiment, power-source voltage or ground voltage is applied to the external electrode 24 of the probe card with the respective testing electrodes 12 of the semiconductor chips 11 formed in the semiconductor wafer 10 being connected to the corresponding probe terminals 21 of the probe card. Thereafter, the semiconductor wafer 10 and the probe card are held at a specified temperature for a burn-in process with the voltage being applied to each of the testing electrodes 12.

If an extraordinarily large quantity of current flows through the defective one of the semiconductor chips 11, the large quantity of current also flows through the PTC element 22 connected to the defective semiconductor chip 11. Accordingly, the temperature of the PTC element 22 through which the current has flown is increased to a high degree, which remarkably increases the resistance thereof and prevents the voltage from being applied to the defective semiconductor chip 11.

This suppresses the temperature increase in the defective semiconductor chip 11, so that the semiconductor chip 11 adjacent to the defective one is prevented from being heated to an extraordinarily high temperature and inhibiting the normal burn-in process. This also suppresses the occurrence of a short circuit in the power-source voltage line and ground voltage line via the defective semiconductor chip 11, so that there is no such case where a voltage is prevented from being applied to the conforming semiconductor chips 11.

According to the second embodiment, since the plurality of probe terminals 21 and the common voltage supply line 25 are provided on the surface of the card body 20 and the PTC elements 22 are provided on the peripheral portions of the surface of the card body 20, there is no need to provide contacts for connecting the plurality of probe terminals 21 to the common voltage supply line 25 through the card body 20, resulting in easy manufacturing of the probe card.

It is to be noted that the method of testing semiconductor devices by using the probe card according to the second embodiment is not limited to a burn-in process performed with respect to the semiconductor chips formed in a wafer, but may be applied to the testing of normal electric characteristics.

Embodiment 3

A probe card according to a third embodiment of the present invention and a method of testing semiconductor integrated circuits by using the probe card will be described with reference to FIGS. 3(a) and 3(b).

Figure 3A:
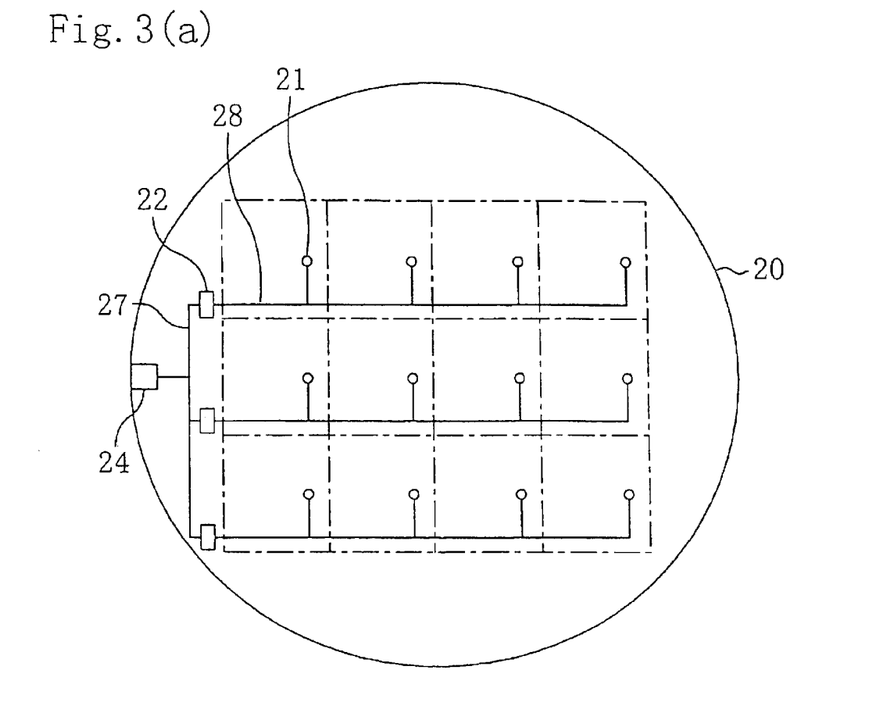
FIG. 3(a) is a plan view thereof and FIG. 3(b) is a cross-sectional view thereof.
Figure 3B:
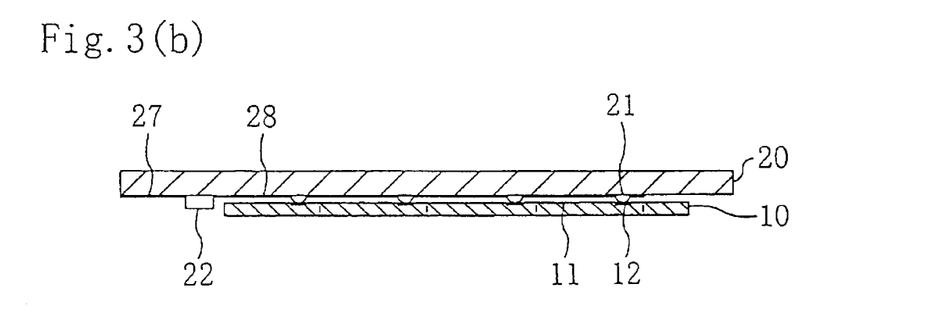

FIG. 3(a) shows the plan structure of the surface of the probe card and FIG. 3(b) shows the cross-sectional structure of the probe card.

As shown in FIGS. 3(a) and 3(b), probe terminals 21 are formed on the surface of a card body 20 constituting a probe card to correspond to the respective testing electrodes 12 of a semiconductor chip 11. PTC elements 22 are formed on the peripheral portions of the surface of the card body 20 to correspond to blocks of probe terminals 21 in a one-to-one relationship. An external electrode 24 to which a voltage is applied from an external device is also formed on the peripheral portion of the surface of the card body 20. A first common voltage supply line 27 for connecting the external electrode 24 to each of the PTC elements 22 extends divergently over the surface of the card body 20, while the probe terminals 21 contained in each one of the blocks are connected to the corresponding PTC element 22 by the common voltage supply line 28. With the arrangement, a voltage applied to the external electrode 24 is applied to each of the probe terminals 21 via the first common voltage supply line 27, the PTC elements 22, and the second common voltage supply line 28. It is to be noted that each of the first and second common voltage supply lines 27 and 28 may be a power-source-voltage supply line for applying power-source voltage or a ground-voltage supply line for applying power-source voltage.

As the PTC element 22, a polymer PTC element or a ceramic PTC element composed of barium titanate or the like may be used, similarly to the first embodiment.

A description will be given to the method of testing semiconductor devices by using the probe card according to the third embodiment.

Similarly to the first embodiment, power-source voltage or ground voltage is applied to the external electrode 24 of the probe card with the respective testing electrodes 12 of the semiconductor chips 11 formed on a semiconductor wafer 10 being connected to the corresponding probe terminals 21 of the probe card. Thereafter, the semiconductor wafer 10 and the probe card are held at a specified temperature for a burn-in process with the voltage being applied to each of the testing electrodes 12.

When an extraordinarily large quantity of current flows through the defective one of the semiconductor chips 11, the large quantity of current also flows through the PTC element 22 connected to the block containing the defective semiconductor chip 11 so that the temperature of the PTC element 22 through which the large quantity of current has flown is increased to a high degree, which remarkably increases the resistance thereof and prevents the voltage from being applied to the defective semiconductor chip 11.

This suppresses the occurrence of a short circuit in the power-source voltage line and the ground voltage line via the defective semiconductor chip 11 so that there is no such case where voltage is prevented from being applied to the conforming semiconductor chips 11 contained in the blocks not containing the defective semiconductor chip 11.

It is to be noted that the method of testing semiconductor devices by using the probe card according to the third embodiment is not limited to a burn-in process performed with respect to the semiconductor chips formed in a wafer, but may be applied to the testing of normal electric characteristics.

Embodiment 4

Figure 4:
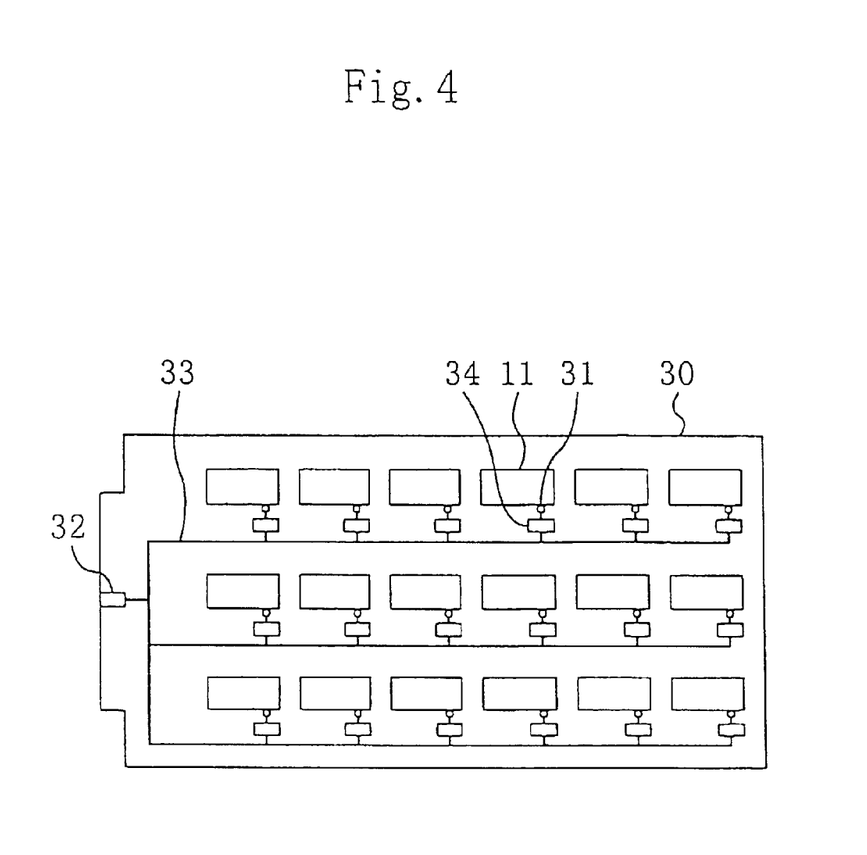
FIG. 4 is a plan view of a burn-in board according to a fourth embodiment of the present invention.

A burn-in board according to a fourth embodiment of the present invention and a method of testing semiconductor integrated circuits by using the burn-in board will be described with reference to FIG. 4. The fourth embodiment provides the burn-in board for performing a simultaneous burn-in process with respect to a plurality of semiconductor chips 11 placed on a board body 30 constituting the board with the application of a voltage to the respective testing electrodes of the semiconductor chips 11. In FIG. 4, the drawing of the respective testing electrodes of the semiconductor chips 11 is omitted.

A plurality of connection terminals 31 to be connected to the respective testing electrodes of the semiconductor chips 11 are provided on the respective portions of the surface of the board body 30 on which the semiconductor chips 11 are to be placed. An external electrode 32 is formed on the edge portion of the board body 30, while a common voltage supply line 33 extending from the external electrode 32 toward the individual connection terminals 31 is formed over the board body 30. The structure described thus far is the same as that of a conventionally known burn-in board.

The fourth embodiment is characterized in that PTC elements 34 are provided such that one PTC element 34 is interposed between the common voltage supply line 33 and one of the connection terminals 31. As the PTC element 34, a polymer PTC element or a ceramic PTC element composed of barium titanate or the like may be used, similarly to the first embodiment.

A description will be given to the method of testing semiconductor devices by using the burn-in board according to the fourth embodiment.

Power-source voltage or ground voltage is applied to the external electrode 32 of the burn-in board with the respective testing electrodes of the semiconductor chips 11 placed on the board body 30 of the burn-in board being connected to the corresponding connection terminals 31 of the burn-in board. Thereafter, the semiconductor chips 11 are held at a specified temperature for a burn-in process with the voltage being applied to each of the testing electrodes.

If an extraordinarily large quantity of current flows through the defective one of the semiconductor chips 11, the large quantity of current also flows through the PTC element 34 connected to the defective semiconductor chip 11 so that the temperature of the PTC element 34 through which the large quantity of current has flown is increased to a high degree, which remarkably increases the resistance thereof and prevents the voltage from being applied to the defective semiconductor chip 11.

This suppresses the occurrence of a short circuit in the power-source voltage line and the ground voltage line via the defective semiconductor chip 11 so that there is no such case where voltage is prevented from being applied to the conforming semiconductor chips 11.

What is claimed is:

1. A method of testing plural semiconductor integrated circuit devices by using a burn-in board,
the method comprising the steps of:
mounting the semiconductor integrated circuit devices on the burn-in board, and
simultaneously testing the plural semiconductor integrated circuit devices for electric characteristics by applying a voltage to respective testing electrodes of the plural semiconductor integrated circuit devices from a common voltage supply line via plural PTC elements on the burn-in board so as to perform a simultaneous burn-in process, and preventing voltage application to the testing electrode of a defective one out of the plural of semiconductor integrated circuit devices that allows excessive currents to flow thereinto, wherein the prevention of voltage application results from an increase in resistance of one of the plural PTC elements electrically connected with the defective semiconductor integrated circuit device, which follows a temperature increase thereof caused by the excessive current-flow into the defective semiconductor integrated circuit device.

* * * * *